US010062543B2

(12) United States Patent
Gupta et al.

(10) Patent No.: US 10,062,543 B2
(45) Date of Patent: Aug. 28, 2018

(54) DETERMINING MULTI-PATTERNING STEP OVERLAY ERROR

(71) Applicant: KLA-Tencor Corporation, Milpitas, CA (US)

(72) Inventors: Ajay Gupta, Cupertino, CA (US); Thanh Huy Ha, Milpitas, CA (US); Olivier Moreau, Sunnyvale, CA (US); Kumar Raja, Concord, CA (US)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 15/170,881

(22) Filed: Jun. 1, 2016

(65) Prior Publication Data
US 2016/0377425 A1   Dec. 29, 2016

Related U.S. Application Data

(60) Provisional application No. 62/183,277, filed on Jun. 23, 2015, provisional application No. 62/279,644, filed on Jan. 15, 2016.

(51) Int. Cl.
*G06K 9/00* (2006.01)
*H01L 21/76* (2006.01)
(Continued)

(52) U.S. Cl.
CPC ........ *H01J 37/222* (2013.01); *G03F 7/70633* (2013.01); *H01J 2237/221* (2013.01);
(Continued)

(58) Field of Classification Search
USPC .................. 382/151, 145; 438/401; 356/401; 257/797; 700/121
See application file for complete search history.

(56) References Cited

U.S. PATENT DOCUMENTS 5,939,226 A * 8/1999 Tomimatu ............... G03F 7/706
430/22
6,061,606 A * 5/2000 Ross ................... G03F 7/70633
257/466
(Continued)

FOREIGN PATENT DOCUMENTS

JP    2014-160868    9/2014
WO    2014/081897    5/2014

OTHER PUBLICATIONS

International Search Report for PCT/US2016/036052 dated Aug. 19, 2016.
(Continued)

*Primary Examiner* — Kathleen Y Dulaney
(74) *Attorney, Agent, or Firm* — Ann Marie Mewherter

(57) ABSTRACT

Methods and systems for determining overlay error between different patterned features of a design printed on a wafer in a multi-patterning step process are provided. For multi-patterning step designs, the design for a first patterning step is used as a reference and designs for each of the remaining patterning steps are synthetically shifted until the synthetically shifted designs have the best global alignment with the entire image based on global image-to-design alignment. The final synthetic shift of each design for each patterning step relative to the design for the first patterning step provides a measurement of relative overlay error between any two features printed on the wafer using multi-patterning technology.

22 Claims, 8 Drawing Sheets

(51) Int. Cl.
*G01B 11/00* (2006.01)
*H01L 23/544* (2006.01)
*G06F 19/00* (2018.01)
*H01J 37/22* (2006.01)
*G03F 7/20* (2006.01)

(52) U.S. Cl.
CPC ............... *H01J 2237/24578* (2013.01); *H01J 2237/31798* (2013.01)

(56) References Cited

U.S. PATENT DOCUMENTS

| | | | |
|---|---|---|---|
| 6,886,153 B1 | 4/2005 | Bevis | |
| 6,902,855 B2 | 6/2005 | Peterson et al. | |
| 7,230,705 B1* | 6/2007 | Yang | G03F 7/70633 257/797 |
| 7,236,244 B1 | 6/2007 | Yang et al. | |
| 7,241,991 B1 | 7/2007 | Standiford et al. | |
| 7,418,124 B2 | 8/2008 | Peterson et al. | |
| 7,570,796 B2 | 8/2009 | Zafar et al. | |
| 7,571,422 B2 | 8/2009 | Adel et al. | |
| 7,676,077 B2 | 3/2010 | Kulkarni et al. | |
| 7,769,225 B2 | 8/2010 | Kekare et al. | |
| 7,853,920 B2 | 12/2010 | Preil et al. | |
| 8,041,106 B2 | 10/2011 | Pak et al. | |
| 8,194,968 B2 | 6/2012 | Park et al. | |
| 8,213,704 B2 | 7/2012 | Peterson et al. | |
| 8,453,075 B2 | 5/2013 | Guo et al. | |
| 8,547,429 B2 | 10/2013 | Honda et al. | |
| 8,559,001 B2 | 10/2013 | Chang et al. | |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 8,755,045 B2 | 6/2014 | Lin et al. | |
| 8,923,600 B2 | 12/2014 | Zafar et al. | |
| 9,087,367 B2 | 6/2015 | Chang et al. | |
| 2003/0021465 A1* | 1/2003 | Adel | G03F 7/70633 382/151 |
| 2009/0290782 A1 | 11/2009 | Regensburger | |
| 2009/0297019 A1 | 12/2009 | Zafar et al. | |
| 2010/0073690 A1* | 3/2010 | Taylor | G03F 7/70633 356/630 |
| 2011/0131007 A1* | 6/2011 | Huang | G03F 7/70633 702/150 |
| 2011/0155904 A1* | 6/2011 | Hotta | G03F 7/70466 250/307 |
| 2011/0170091 A1 | 7/2011 | Chang et al. | |
| 2011/0202298 A1* | 8/2011 | Izikson | H01L 22/20 702/83 |
| 2012/0029858 A1 | 2/2012 | Kulkarni et al. | |
| 2012/0033215 A1* | 2/2012 | Kandel | G03F 7/70633 356/366 |
| 2012/0216169 A1 | 8/2012 | Park et al. | |
| 2012/0243773 A1 | 9/2012 | Kulkarni et al. | |
| 2013/0107259 A1* | 5/2013 | Choi | G03F 7/70683 356/401 |
| 2013/0242305 A1* | 9/2013 | Cohen | G03F 7/70633 356/400 |
| 2014/0036243 A1* | 2/2014 | Beyer | G03F 1/72 355/52 |
| 2014/0105482 A1 | 4/2014 | Wu et al. | |
| 2014/0270469 A1* | 9/2014 | Rotem | G06T 7/001 382/145 |
| 2014/0270474 A1 | 9/2014 | Huang et al. | |
| 2015/0012900 A1 | 1/2015 | Shifrin et al. | |
| 2016/0116420 A1 | 4/2016 | Duffy et al. | |
| 2016/0334208 A1* | 11/2016 | Liou | G03F 7/70633 |

OTHER PUBLICATIONS

Written Opinion for PCT/US2016/036052 dated Aug. 19, 2016.
Inoue et al., "In-die Overlay Metrology by using CD-SEM," Metrology, Inspection, and Process Control for Microlithography XXVII, edited by Alexander Starikov, Proc. of SPIE, vol. 8681, 86812S, 2013.
Jank et al., "Method for fast and accurate calibration of litho simulator for hot spot analysis," IEEE International Symposium on Semiconductor Manufacturing 2006, ISSM 2006, Oct. 2006, 4 pages.
Lorusso et al., "Advanced DFM applications using Design Based Metrology on CD SEM," Proc. SPIE 6152, Metrology, Inspection, and Process Control for Microlithography XX, 61520B (Mar. 27, 2006), 13 pages.

\* cited by examiner

DETERMINING MULTI-PATTERNING STEP OVERLAY ERROR

BACKGROUND OF THE INVENTION

1. Field of the Invention

The present invention generally relates to determining multi-patterning step overlay error. Certain embodiments relate to methods and systems for determining overlay error between different patterned features printed on a level of a wafer in different steps of a multi-patterning step process.

2. Description of the Related Art

The following description and examples are not admitted to be prior art by virtue of their inclusion in this section.

Fabricating semiconductor devices such as integrated circuits involves forming multiple layers on a wafer. Different structures are formed on different layers of the wafer, and some structures are intended to be electrically connected to each other while other structures are intended to be insulated from one another. If the structures on one layer are not properly aligned with other structures of the same or other layers, the misalignment of the structures can prevent the proper electrical connection of some structures and/or the proper insulation for other structures. Therefore, measuring and controlling the alignment of structures on a wafer is important in the successful manufacture of working semiconductor devices.

Generally, the alignment of structures on a wafer is determined by the error sources (e.g., alignment of a reticle, alignment of the wafer, etc.) in an exposure step of a lithography process performed on the wafer. In particular, since the lithography process involves forming patterned features in a resist material that are then transferred to a device material using other fabrication processes, the lithography process generally controls where the patterned features and therefore where device structures formed from the patterned features) are formed on the wafer. Therefore, measuring and controlling alignment of features on one layer with respect to features on the same or another layer before, during, and/or after the lithography process is a critical step in the fabrication process.

Accordingly, it would be advantageous to develop systems and methods for determining overlay error between different patterned features of a design printed on a wafer in a multi-patterning step process that do not have one or more of the disadvantages of currently used methods and systems.

SUMMARY OF THE INVENTION

The following description of various embodiments is not to be construed in any way as limiting the subject matter of the appended claims.

One embodiment relates to a system configured to determine overlay error between different patterned features of a design printed on a wafer in a multi-patterning step process. The system includes an output acquisition subsystem that includes at least an energy source and a detector. The energy source is configured to generate energy that is directed to a wafer. The detector is configured to detect energy from the wafer and to generate output responsive to the detected energy. First and second patterned features are printed on a level of the wafer with first and second patterning steps, respectively. The system also includes one or more computer subsystems configured for aligning a design for the level of the wafer to an image for the wafer generated from the output thereby aligning the design for the first patterned features to the first patterned features in the image thereby aligning all of the design for the level to the first patterned features. The computer subsystem(s) are also configured for shifting only the design for the second patterned features from a position of the design for the second patterned features, determined by the aligning all of the design, to a shifted position of the design for the second patterned features by aligning only the design for the second patterned features to only the second patterned features in the image. In addition, the computer subsystem(s) are configured for determining an offset between the position of the design for the second patterned features and the shifted position of the design for the second patterned features. The offset is equal to relative overlay error between the first patterned features on the wafer and the second patterned features on the wafer. The system may be further configured as described herein.

Another embodiment relates to a computer-implemented method for determining overlay error between different patterned features of a design printed on a wafer in a multi-patterning step process. The method includes the aligning, shifting, and determining described above. The steps of the method are performed by one or more computer systems.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for determining overlay error between different patterned features of a design printed on a wafer in a multi-patterning step process. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
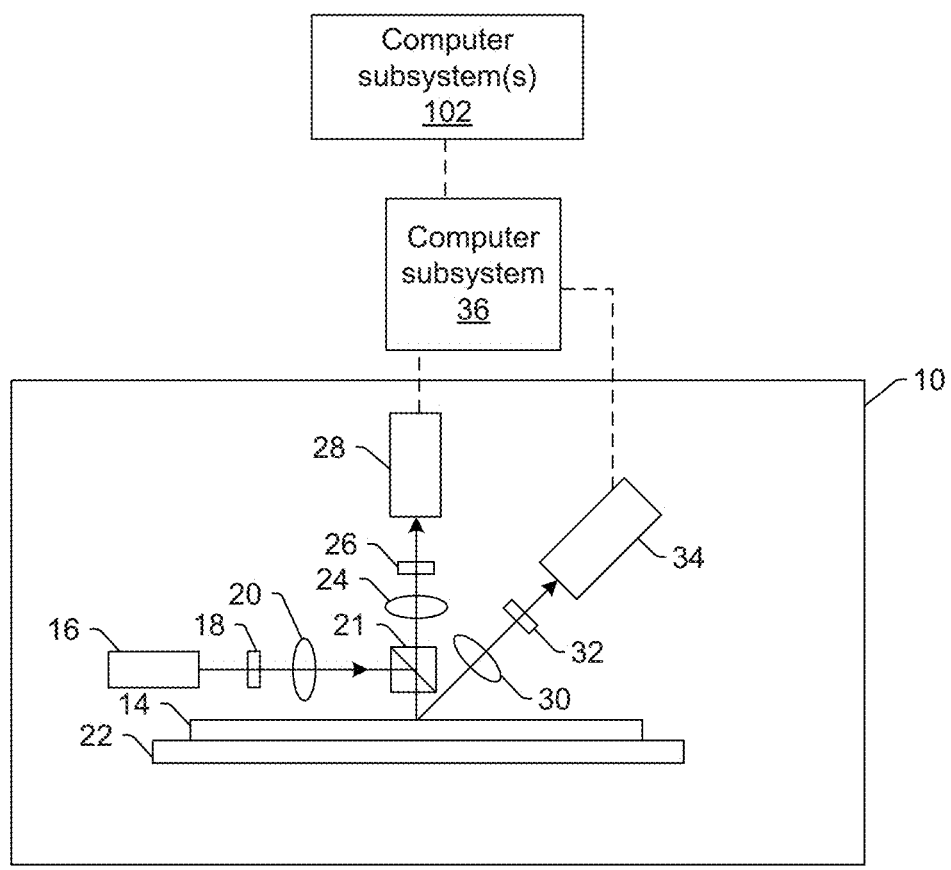
FIGS. 1 and 2 are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design analysis. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

Preferably, the "design" or "physical design" as those terms are used herein refer to the design as it would be ideally formed on the wafer. In this manner, a design or physical design described herein would preferably not include features of the design that would not be printed on the wafer such as optical proximity correction (OPC) features, which are added to the design to enhance printing of the features on the wafer without actually being printed themselves. In this manner, in some embodiments, the design for the wafer used for steps described further herein does not include features of the design that will not be printed on the wafer.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to determine overlay error between different patterned features of a design printed on a wafer in a multi-patterning step process. The wafer may include any wafer known in the art. One embodiment of such a system is shown in FIG. 1. The system includes an output acquisition subsystem that includes at least an energy source and a detector. The energy source is configured to generate energy that is directed to a wafer. The detector is configured to detect energy from the wafer and to generate output responsive to the detected energy.

In one embodiment, the energy directed to the wafer includes light, and the energy detected from the wafer includes light. For example, in the embodiment of the system shown in FIG. 1, output acquisition subsystem 10 includes an illumination subsystem configured to direct light to wafer 14. The illumination subsystem includes at least one light source. For example, as shown in FIG. 1, the illumination subsystem includes light source 16. In one embodiment, the illumination subsystem is configured to direct the light to the wafer at one or more angles of incidence, which may include one or more oblique angles and/or one or more normal angles. For example, as shown in FIG. 1, light from light source 16 is directed through optical element 18 and then lens 20 to beam splitter 1, which directs the light to wafer 14 at a normal angle of incidence. The angle of incidence may include any suitable angle of incidence, which may vary depending on, for instance, characteristics of the wafer.

The illumination subsystem may be configured to direct the light to the wafer at different angles of incidence at different times. For example, the output acquisition subsystem may be configured to alter one or more characteristics of one or more elements of the illumination subsystem such that the light can be directed to the wafer at an angle of incidence that is different than that shown in FIG. 1. In one such example, the output acquisition subsystem may be configured to move light source 16, optical element 18, and lens 20 such that the light is directed to the wafer at a different angle of incidence.

In some instances, the output acquisition subsystem may be configured to direct light to the wafer at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the wafer at the some time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing the light having different or the same characteristics to the wafer at different or the same angles of incidence sequentially or simultaneously.

In one embodiment, light source 16 may include a broadband plasma (BBP) light source. In this manner, the light generated by the light source and directed to the wafer may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the wafer. The illumination subsystem shown in FIG. 1 and described herein may include any other suitable optical elements not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for output acquisition.

The output acquisition subsystem may also include a scanning subsystem configured to cause the light to be scanned over the wafer. For example, the output acquisition subsystem may include stage 22 on which wafer 14 is disposed during output acquisition. The scanning subsystem may include any suitable mechanical and/or robotic assembly (that includes stage 22) that can be configured to move the wafer such that the light can be scanned over the wafer. In addition, or alternatively, the output acquisition subsystem may be configured such that one or more optical elements of the output acquisition subsystem perform some scanning of the light over the wafer. The light may be scanned over the wafer in any suitable fashion.

The output acquisition subsystem further includes one or more detection channels. At least one of the one or more detection channels includes a detector configured to detect light from the wafer due to illumination of the wafer by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the output acquisition subsystem may be signals or data, but not image signals or image data. In such instances, a computer subsystem such as computer subsystem 36 of the system may be configured to generate images of the wafer from the non-imaging output of the detectors. However, in other instances, the detectors may be configured as imaging detectors that are configured to generate imaging signals or image data. Therefore, the system may be configured to generate the images described herein in a number of ways.

It is noted that FIG. 1 provided herein to generally illustrate a configuration of an output acquisition subsystem that may be included in the system embodiments described herein. Obviously, the output acquisition subsystem configuration described herein may be altered to optimize the performance of the system as is normally performed when designing a commercial system. In addition, the systems described herein may be implemented using an existing output acquisition system (e.g., by adding functionality described herein to an existing output acquisition system) such as tools that are commercially available from KLA-Tencor. For some such systems, the methods described herein may be provided as optional functionality of the output acquisition system (e.g., in addition to other functionality of the output acquisition system). Alternatively, the system described herein may be designed "from scratch" to provide a completely new system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the wafer. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based output acquisition subsystem, the output acquisition subsystem may be an electron beam-based output acquisition subsystem. For example, in one embodiment, the energy directed to the wafer includes electrons, and the energy detected from the wafer includes electrons. In this manner, the energy source may be an electron beam source. In one such embodiment shown in FIG. 2, the output acquisition subsystem includes electron column 122, which is coupled to computer subsystem 124.

Figure 2:
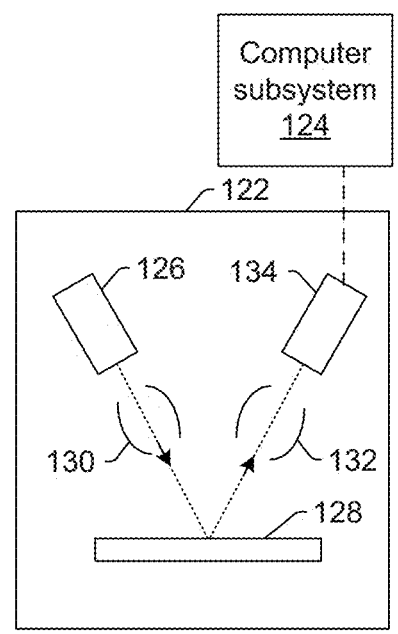

As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the wafer at an oblique angle of incidence and are scattered from the wafer at another oblique angle, it is to be understood that the electron beam may be directed to and scattered from the wafer at any suitable angles. In addition, the electron beam-based output acquisition subsystem may be configured to use multiple modes to generate images of the wafer (e.g., with different illumination angles, collection angles, etc.). The multiple modes of the electron beam-based output acquisition subsystem may be different in any image generation parameters of the output acquisition subsystem.

Computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam-based output acquisition subsystem that may be included in the embodiments described herein. As with the optical output acquisition subsystem described above, the electron beam-based output acquisition subsystem configuration described herein may be altered to optimize the performance of the output acquisition subsystem as is normally performed when designing a commercial output acquisition system. In addition, the systems described herein may be implemented using an existing system e.g., by adding functionality described herein to an existing system) such as the eDR-xxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Although the output acquisition subsystem is described above as being a light-based or electron beam-based output acquisition subsystem, the output acquisition subsystem may be an ion beam-based output acquisition subsystem. Such an output acquisition subsystem may be configured as shown in FIG. 2 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

As described further herein, the embodiments described herein can be used for in-die multi-patterning (e.g., double, triple, quad, etc. patterning) relative overlay measurements using images (e.g., scanning electron microscopy (SEM) images) and design) to measure substantially small (e.g., 2 nm to 5 nm) in-die relative overlay error between patterned features printed with multiple masks (or reticles) due to mask placement error (or other error sources). Determining the relative overlay measurements as described herein may be performed during a lithography processing step (or after at least two lithography multi-patterning process steps have been) performed on a wafer.

Unlike the embodiments described herein, some currently used methods use special overlay targets in the scribe line of a wafer (used for optical or SEM metrology tools) or selected in-die pattern locations having line or point symmetry along a virtual x-axis and/or y-axis. Examples of such currently used methods can be found in U.S. Patent Application Publication No. 2011/0155904 to Hotta et al. published on Jun. 30, 2011 and "In-die Overlay Metrology by using CD-SEM" by Inoue et al., Metrology, Inspection, and Process Control for Microlithography XXVII, edited by Alexander Starikov, Proc. of SPIE, Vol. 8681, 86812S, 2013, both of which are incorporated by reference as if fully set forth herein.

The currently used methods do, however have a number of disadvantages. For example, the currently used methods may use special overlay targets in specific areas of a die or in the scribe line to measure overlay error but may not always predict actual in-die overlay errors. In addition, the currently used methods may not be able to measure overlay errors on all types of complex patterns in-die and instead may select specific in-die pattern locations having line or point symmetry along a virtual x-axis or y-axis.

Figure 3:
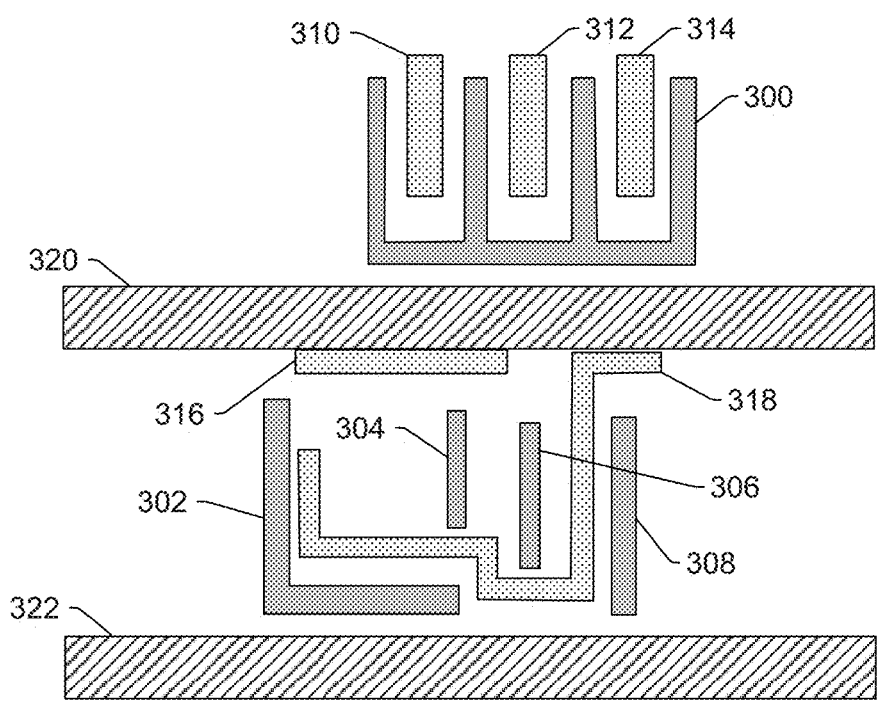
FIG. 3 is a schematic diagram illustrating a plan view of one example of first, second, and third patterned features printed on a level of a wafer with first, second, and third patterning steps, respectively.

First and second patterned features are printed on a level of the wafer with first and second patterning steps, respectively. In addition, third, fourth, etc. patterned features may be printed on the level of the wafer with a third, fourth, etc. patterning step, respectively. For example, as shown in FIG. 3, an entire design for a wafer, only a substantially small portion of which is actually shown in FIG. 3, may be printed on the wafer in different patterning steps. More specifically, the portion of the design shown in FIG. 3 for the wafer includes first patterned features such as features 300, 302, 304, 306, and 308 that are printed on the level of the wafer in a first patterning step. In addition, the portion of the design for the wafer shown in FIG. 3 includes second patterned features such as features 310, 312, 314, 316, and 318 that are printed on the level of the wafer in a second patterning step. The portion of the design for the wafer shown in FIG. 3 includes third patterned features such as features 320 and 322 that are printed on the level of the wafer in a third patterning step.

As shown in FIG. 3, the first patterned features may include different types of features having one or more different characteristics such as shape, size, orientation, etc. Therefore, different types of patterned features may be printed on a wafer in the same single patterning step of a multi-patterning step process. Similarly, the second patterned features may include different types of features that are printed on a wafer in the same single patterning step of a multi-patterning step process. However, the third patterned features may include only the same type of features that have all of the same characteristics such as those listed above. Therefore, only patterned features having the same type may be printed on a wafer in the same single patterning step of a multi-patterning step process. Nevertheless, the first, second, and third patterned features shown in FIG. 3 are not meant to limit the embodiments described herein to any particular types of features that can be printed on a wafer in a multi-patterning step process or for which the embodiments described herein can be performed. Essentially, the embodiments described herein can be performed for any type of patterned features printed on a wafer in any type of a multi-patterning step process. In other words, although some examples of patterned features that may be included in a design for a level of a wafer are shown in FIG. 3 (and other figures described herein), the examples are not meant to be representative of any particular design for any particular wafer. Instead, as will be clear to one of ordinary skill in the art, the design for the level of the wafer may include many different types of patterned features in many different arrangements and in many different numbers. The patterned features shown in FIG. 3 (and other figures described herein) are merely meant to illustrate some hypothetical patterned features to further understanding of various embodiments described herein.

The multi-patterning step process may be performed in any suitable manner. For example, the multi-patterning step process may include a series of lithography steps, performed one after the other. After all of the lithography steps in the series have been performed, the wafer may be etched to thereby transfer all of the patterned features printed in all of the lithography steps from one or more materials in which all of the patterned features are printed in the lithography steps to one or more materials that are etched in the etch process.

However, the multi-patterning step process may include a series of lithography steps, each of which is followed by an etch step before the next lithography step in the series is performed. In other words, the multi-patterning step process may include a sequence of steps that include at least lithography, etch, lithography, and etch, possibly followed by one or more additional lithography, etch sequences.

As described above, the first and second (and any other) patterned features printed in the multi-patterning step process are printed on a level of the wafer. In other words, all of the first and second (and any other) patterned features printed in the multi-patterning step process are printed on the same level of the wafer. In this manner, the first and second (and any other) patterned features described herein are not formed above or below any of the other patterned features described herein. For example, the first and second (and any other) patterned features described herein may have lowermost surfaces that are substantially commensurate with (i.e., substantially planar with the lowermost surfaces of all of the other patterned features described herein (while allowing for normal and usual variations in the upper surfaces of the material(s) formed on the wafer below the level of the wafer). Therefore, the first patterned features described herein are not printed on one level of the wafer while the second patterned features described herein are printed on another, different level of the wafer, and so on, with each different level above (or below) the other.

The computer subsystem(s) described herein may be configured for performing a number of steps for automatic measurement of "coarse" relative overlay error using image-to-design "coarse" alignment. These steps measure "coarse" relative overlay error using "coarse" alignment in that these steps may be followed, as described herein, with additional steps that measure relative overlay error on a finer scale with finer alignment.

Figures 4, 5:
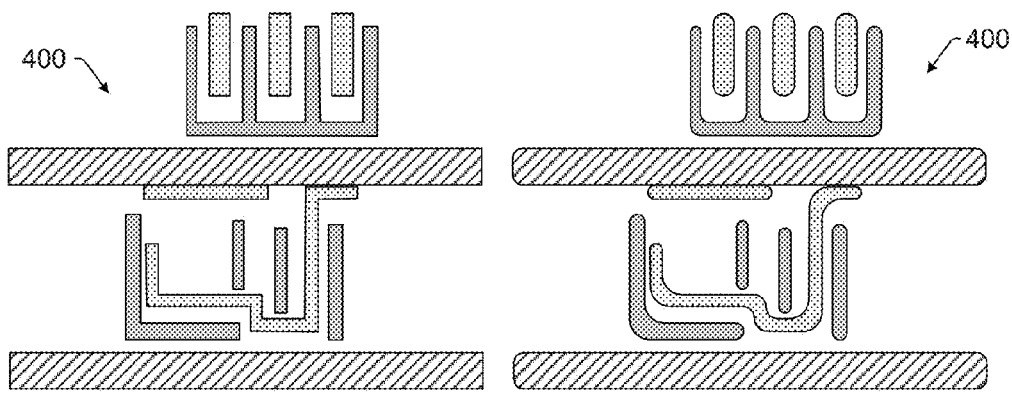
FIG. 4 is a schematic diagram illustrating a plan view of the first, second, and third patterned features of FIG. 3 as they may appear in design space.
FIG. 5 is a schematic diagram illustrating a plan view of the first, second, and third patterned features of FIG. 3 as they may be printed on a wafer.

One example of how patterned features printed on a wafer can be different from patterned features as-designed is shown in FIGS. 4 and 5. In particular, FIG. 4 shows the portion of the design shown in FIG. 3 as the patterned features shown in FIG. 3 are designed while FIG. 5 shows the portion of the design shown in FIG. 3 as the patterned features shown in FIG. 3 may be printed on a wafer. More specifically, due to the inherent limitations of the tools, materials, and processes used to print the patterned features shown in portion 400 of the design, the patterned features will not necessarily be printed on the wafer as they are included in the design. For example, as shown in FIG. 5, instead of the patterned features in portion 400 having sharp, 90 degree corners as shown in the design, the features will have at least somewhat rounded corners. In addition, any of the features may have variations in dimensions such as width at various points across the features. Therefore, due to the differences between the patterned features as-designed and the patterned features as-printed, aligning information for a design to an image of patterned features on a wafer is not always a trivial process. However, as will be described further herein, the embodiments described herein can be used to align information for a design to an image of patterned features with substantially high accuracy which allows for determining relative overlay error with substantially high accuracy.

Figure 6:
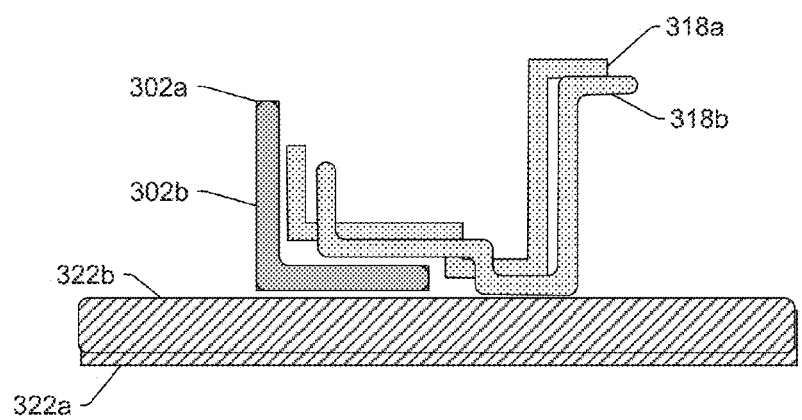
FIG. 6 is a schematic diagram illustrating a plan view of one embodiment of a portion of the features shown in FIG. 3 with all of the design for the level aligned to the first patterned features by aligning the design for the first patterned features to the first patterned features in an image.

The one or more computer subsystems are configured for aligning a design for the level of the wafer to an image for the wafer generated from the output by aligning the design for the first patterned features to the first patterned features in the image thereby aligning all of the design for the level to the first patterned features. The image used in this step and other steps described herein may be generated as described further herein (e.g., by a detector of the output acquisition subsystem or by a computer subsystem of the system using output of a detector). For designs printed on a wafer with multi-patterning steps that are performed using two or more masks, a first portion of the design (the portion of the design for only the first patterned features) corresponding to the features printed on the wafer using only a first mask may be used as a reference. FIG. 6 shows an embodiment of how this step can be performed for only a portion of the patterned features shown in FIG. 3. Of course, this step (and all other steps described herein) can be performed for as many of the patterned features that are shown in any one image and for multiple images. However, FIG. 6 shows this step with only one of the different patterned features printed in each of the different patterning steps shown in FIG. 3.

In the embodiment shown in FIG. 6, patterned features 302a and 302b correspond to patterned feature 302 shown in FIG. 3 where patterned feature 302a is the as-designed version of feature 302 and patterned feature 302b is the as-printed version of feature 302 as it appears in an image of the patterned feature generated from output of an output acquisition subsystem as described herein. In addition, patterned features 318a and 318b correspond to patterned feature 318 shown in FIG. 3 where patterned feature 318a is the as-designed version of feature 318 and patterned feature 318b is the as-printed version of feature 318 as it appears in an image of the patterned feature generated from output of an output acquisition subsystem as described herein. Patterned features 322a and 322b correspond to patterned feature 322 shown in FIG. 3 where patterned feature 322a is the as-designed version of feature 322 and patterned feature 322b is the as-printed version of feature 322 as it appears in an image of the patterned feature generated from output of an output acquisition subsystem as described herein. As such, the as-designed versions of the patterned features in FIG. 6 show the patterned features as they are designed while the other versions of the patterned features shown the patterned features as they might be imaged by a subsystem described herein. Therefore, as shown in FIG. 6, different versions of the same patterned feature are different from each other due to the issues described further above.

As further shown in FIG. 6, the computer subsystem(s) may align the design for the level of the wafer to an image for the wafer generated from the output by aligning the design for the first patterned features (i.e., in the case of FIG. 6, patterned feature 302a) to the first patterned features in the image (i.e., in the case of FIG. 6, patterned feature 302b) thereby aligning all of the design for the level to the first patterned features. In this manner, this aligning step may treat the entire portion of the design being used for this aligning step as a single unit, which is shifted in its entirety, to align all of the design to the first patterned features in the image. In other words, by aligning the first patterned features in the design to the first patterned features in the image and by treating the entire design as a single unit, the entire portion of the design will be aligned to the first patterned features in the design.

However, since there may have been alignment or other error issues between the multi-patterning steps, aligning the entire portion of the design to the image based on only the first patterned features in the design and the image may not align the entire portion of the design to all of the patterned features in the image (when two or more of the patterned features in the image are printed in different patterning steps). In other words, if the patterned features are not printed on the wafer in one of the multi-patterning steps with the as-designed spatial relationships to other patterned features on the wafer printed in a different of the multi-patterning steps, then the patterned features printed in different patterning steps may not have the same spatial relationship in the design and in an image of the patterned features as printed on the wafer. In this manner, when the entire portion of the design is aligned to the entire image based on only the patterned features formed in one of the multi-patterning steps, portions of the design other than that used for such aligning may not be aligned to their corresponding patterned features in the image. For example, as shown in FIG. 6, even though patterned feature 302a in the design has been aligned to patterned feature 302b in an image, patterned features 318a and 322a in the design are not aligned to their corresponding patterned features 318b and 322b in the image.

Although aligning an entire portion of a design for multi-patterning steps to only the patterned features for only one of the multi-patterning steps in an image would seem to be problematic (as it only accurately aligns a portion of the design to a portion of the imaged patterned features), the inventors have discovered that the different alignment results between the design and image for different patterned features printed in different multi-patterning steps can be used to determine relative overlay as described herein. For example, the one or more computer subsystems are also configured for shifting only the design for the second patterned features from a position of the design for the second patterned features, determined by aligning all of the design, to a shifted position of the design for the second patterned features by aligning only the design for the second patterned features to only the second patterned features in the image. In this manner, as described above, first patterned features printed in a first patterning step with a first mask may be used as a reference, and the patterned features printed in each of the remaining patterning step(s) with other mask(s), i.e., the second, third, and so on patterning steps, are "synthetically" shifted in x and/or y until the "synthetically" shifted design portion has the best global x/y alignment with the entire image. The "best global" alignment may be determined based on a global image-to-design alignment score or metric of any image-to-design alignment algorithm and/or method. This alignment is "global" in the sense that when the shifting is performed form patterned feature in the design that is printed in a multi-patterning step other than the one being used as the reference, the shifting is performed for all of the patterned features shown in the image that are formed in the same multi-patterning step as the patterned feature. In other words, the alignment is performed simultaneously for more than one feature when more than one feature is shown in the image for the portion of the design for which the shifting is being performed. In this manner, this alignment step performs shifting for multiple features collectively.

Figure 7:
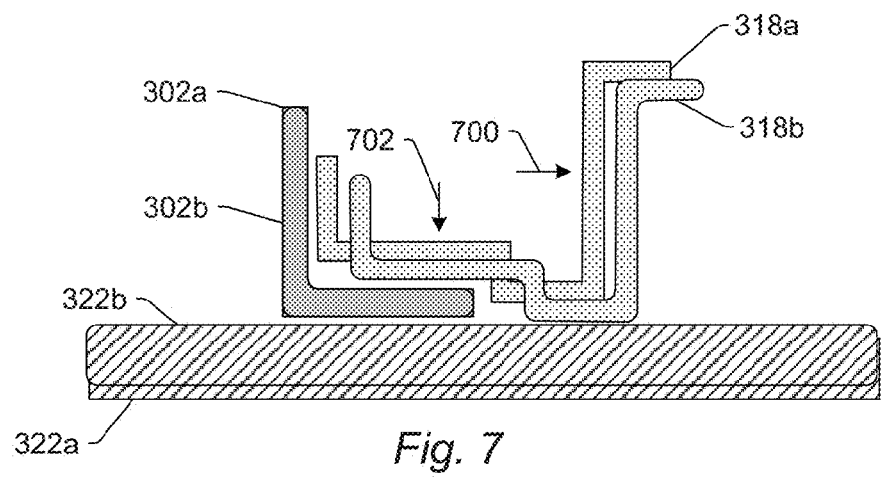
FIG. 7 is a schematic diagram illustrating a plan view of one embodiment of the portion of the features shown in FIG. 6 with arrows showing how the design for one of the second patterned features may be shifted to align only the design for the second patterned feature to only the second patterned feature in the image.
Figure 8:
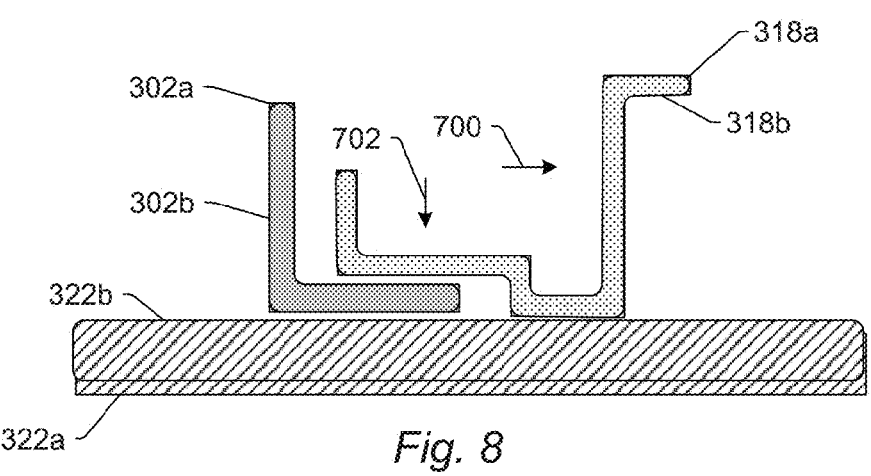
FIG. 8 is a schematic diagram illustrating a plan view of one embodiment of the portion of the features shown in FIG. 6 after the design for one of the second patterned features has been shifted to align only the design for the second patterned feature to only the second patterned feature in the image.

In one such example, as shown in FIG. alignment of the design for the level of the wafer to the first patterned features has not resulted in alignment of the design for the second patterned features to the second patterned features in the image. Therefore, the computer subsystem(s) may shift the design for the second patterned features, and only the second patterned features, until the design for the second patterned features is aligned to the second patterned features in the image. In particular, as shown in FIG. 7, the computer subsystem(s) may shift patterned feature 318a in the design in directions 700 and 702 until patterned feature 318a is substantially aligned with patterned feature 318b in the image. For example, patterned feature 318a may be shifted in directions 700 and 702 until patterned feature 318a is substantially aligned with patterned feature 318b, as shown in FIG. 8. Shifting the design for only a portion of the patterned features may be performed using any suitable method and/or algorithm. In addition, determining when an amount of shifting has resulted in alignment of a patterned feature in a design with its corresponding patterned feature in an image may be performed using any suitable alignment method and/or algorithm. Furthermore, shifting the design for the patterned features printed in a second, third, etc. multi-patterning step may be performed in the x and/or y directions.

The one or more computer subsystems are further configured for determining an offset between the position of the design for the second patterned features and the shifted position of the design for the second patterned features, and the offset is equal to relative overlay error between the first patterned features on the wafer and the second patterned features on the wafer. For example, the final synthetic x and/or y shift of each portion of the design relative to the first portion of the design provides a measurement of x and/or y relative overlay error between the first portion of the design for the level and any other portion of the design for the level printed on the wafer using multi-patterning step process technology. These "synthetic" shifts, each determined with respect to the first portion of the design for the level used as the reference for the other measurements, can therefore be used as described further herein to determine other shifts between other portions of the design. Since the offset is determined with respect to relatively "coarse" alignment results, the offset wilt be a relatively "coarse" image-to-design shift between different patterned features printed in the different patterning steps.

In one such example, as shown in FIGS. 7 and 8, the offset may be determined as a difference between the position of patterned feature 318a as shown in FIG. 7, which is the position of patterned feature 318a determined by aligning all of the design to the first patterned features, and the position of patterned feature 318b as shown in FIG. 8, which is the position of patterned feature 318a after it has been aligned to its corresponding feature in the image of the wafer, i.e., patterned feature 318b. In this manner, the offset that is determined by the computer subsystem(s) is essentially the amount that the patterned feature as-designed was shifted until it was aligned with its corresponding patterned feature as-imaged. Therefore, the offset may be determined in the same directions that the patterned feature as-designed was shifted. For example, the offset may include an offset in the x direction and an offset in they direction. In addition, the offset may be a single offset expressed in both or either of the x and y directions.

As described further above, after the entire design for the patterned features in an image has been aligned to the first patterned features in the image, the entire design should be aligned to all of the patterned features not just the first patterned features printed in the first patterning step) shown in the image if the multi-patterning step process was performed without any overlay errors. In other words, the different portions of the design printed in the different patterning steps would have spatial relationships between one another on the wafer as they were designed. After the entire design for the patterned features in the image has been aligned to the first patterned features, any misalignment between patterned features other than the first in the design and the image will be indicative of the alignment or overlay errors in the printing. In addition, the misalignment will be proportional (or otherwise related) Co the errors. As such, the amount that the portion of the design was shifted to achieve alignment between the portion of the design and the image will be proportional (or otherwise related) to the errors. Consequently, the offset determined based on the shifting amount (or the difference between the pre- and post-shifting positions is proportional (or otherwise related) to the errors. For example, the pre- and post-shifting positions of a patterned feature may be determined with respect to the image generated for the wafer. Therefore, the offset may be determined in units of (or in terms of) pixels in the image (since the design for a patterned feature may be shifted from being overlaid with a first set of pixels in the image to being overlaid with a second set of pixels in the image). In addition, since the dimensions on the wafer that correspond to each pixel can be determined (e.g., based on the parameters of the output acquisition subsystem such as magnification, detector pixel size, and the like), the offset in units of pixels can be translated to units of length (e.g., nm) in any suitable manner. Therefore, the offset and the relative overlay error can be determined in units of pixels, length, or any other suitable unit. As such, the relative overlay error determined as described herein can be a direct measurement of the relative overlay error of two different patterning steps on the wafer.

As described above, in one embodiment, third patterned features are printed on the level of the wafer with a third patterning step. In one such embodiment, the computer subsystem(s) are configured for shifting only the design for the third patterned features from a position of the design for the third patterned features, determined by the aligning all of the design, to a shifted position of the design for the third patterned features by aligning only the design for the third patterned features to only the third patterned features in the image. This "synthetic" shift of a portion of the design may be performed as described further above. In one such example, as shown in FIG. 7, alignment of the design for the level of the wafer to the first patterned features has not resulted in alignment of the design for the third patterned features to the third patterned features in the image. In addition, as shown in FIG. 8, alignment of the design for the second patterned features to the second patterned features in the image has not resulted in alignment of the design for the third patterned features to the third patterned features in the image (since alignment of the design for the second patterned features to the second patterned features in the image involved shifting of the design for only the second patterned features, and not the third patterned features, with respect to the image).

Figure 9:
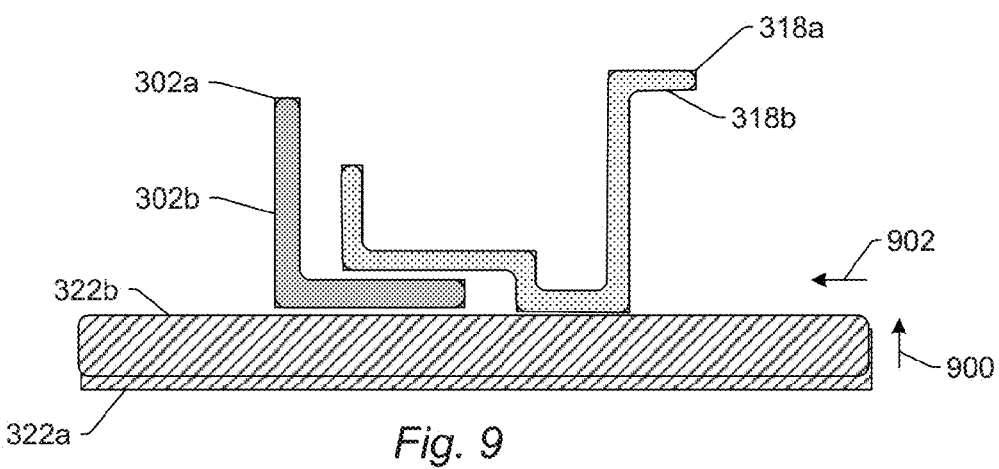
FIG. 9 is a schematic diagram illustrating a plan view of one embodiment of the portion of the features shown in FIG. 6 with arrows showing how the design for one of the third patterned features may be shifted to align only the design for the third patterned feature to only the third patterned feature in the image.
Figure 10:
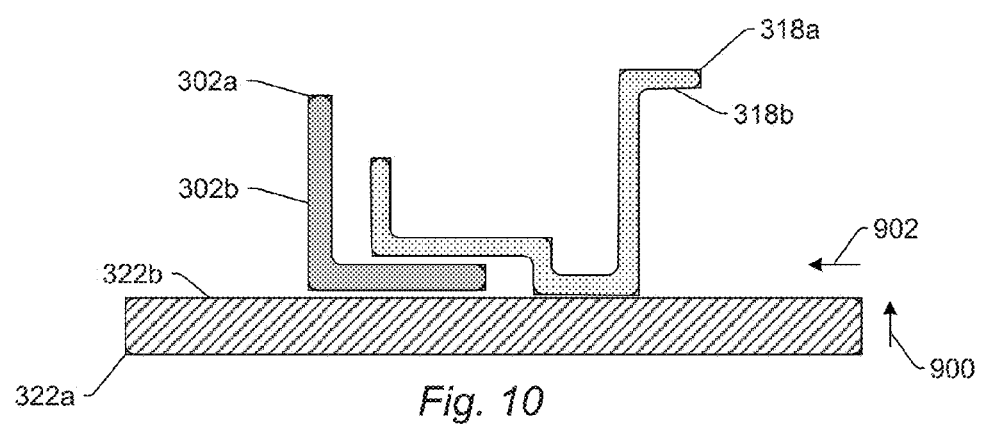
FIG. 10 is a schematic diagram illustrating a plan view of one embodiment of the portion of the features shown in FIG. 6 after the design for one of the third patterned features has been shifted to align only the design for the third patterned feature to only the third patterned feature in the image.

Therefore, the computer subsystem(s) may shift the design for the third patterned features, and only the third patterned features, until the design for the third patterned features is aligned to the third patterned features in the image. In particular, as shown in FIG. 9, the computer subsystem(s) may shift patterned feature 322a in the design in directions 900 and 902 until patterned feature 322a is substantially aligned with patterned feature 322b in the image. For example, patterned feature 322a may be shifted in directions 900 and 902 until patterned feature 322a is substantially aligned with patterned feature 322b, as shown in FIG. 10. Shifting the design for only the third patterned features may be further performed as described herein.

In such an embodiment, the computer subsystem(s) may also be configured for determining an offset between the position of the design for the third patterned features and the shifted position of the design for the third patterned features, and the offset for the third patterned features is equal to relative overlay error between the first patterned features on the wafer and the third patterned features on the wafer. The offset may be determined as described further herein, and the offset for the third patterned features may be equal to the relative overlay offset between the first and third patterned features on the wafer as described further herein. Since the offset is determined with respect to relatively "coarse" alignment results, this offset will be a relatively "coarse" image-to-design shift between different patterned features printed in the different patterning steps.

In one such embodiment, the computer subsystem(s) are configured for determining relative overlay error between the second patterned features on the wafer and the third patterned features on the wafer based on the offset determined for the second patterned features and the offset determined for the third patterned features. For example, the final synthetic x and/or y shift of each portion of the design relative to the first portion of the design provides a measurement of x and/or y relative overlay error between any two portions of the design printed on the wafer using multi-patterning step process technology. In other words, once the offset has been determined between the first patterned features and any other patterned features (e.g., second, third, etc. patterned features), any two offsets can be used to determine the relative overlay error between any two sets of patterned features. For example, once the offset has been determined for the second patterned features relative to the first patterned features and the offset has been determined for the third patterned features relative to the first patterned features, those two offsets may be used to determine the offset, and therefore the relative overlay error, between the second and third patterned features. Such determinations may be performed in any suitable manner known in the art. Since the offsets are determined with respect to relatively "coarse" alignment results, the offsets used to determine the relative overlay error between any two layers will be a relatively "coarse" image-to-design shift between different patterned features printed in the different patterning steps.

Some additional embodiments described herein are configured for automatic measurement of fine relative overlay error using image-to-design fine alignment based on center lines. Image-to-design fine alignment may be performed since the global alignment described above may not be sensitive enough to allow measurement of substantially small (e.g., 2 nm to 5 nm) relative overlay errors. For example, in some embodiments of aligning the image generated from output of the output acquisition subsystem to the design, imaginary center lines drawn through the patterned features in the image and the design may be used for fine alignment.

Figures 11, 12:
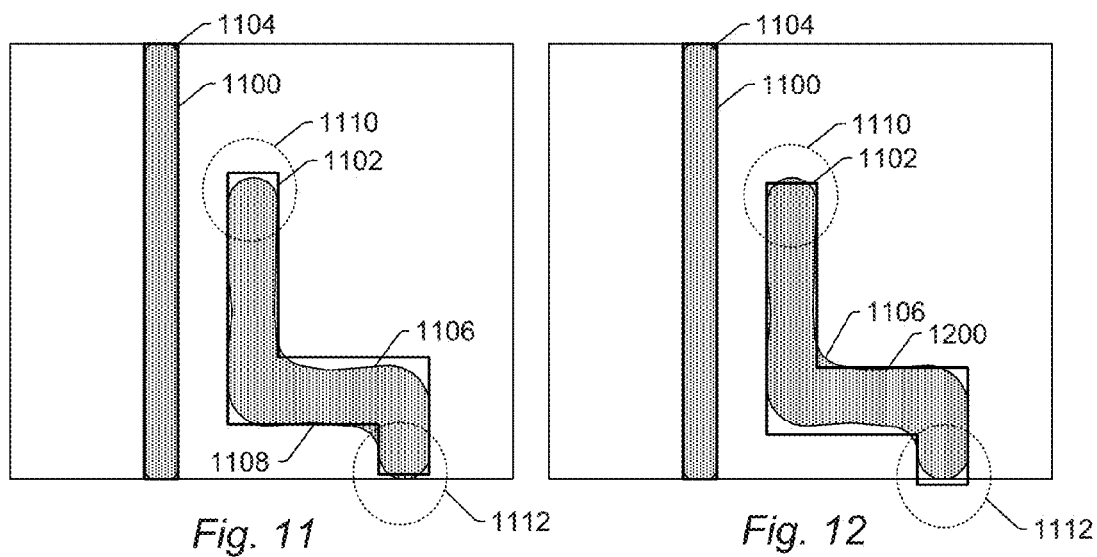
FIGS. 11-12 are schematic diagrams illustrating plan views of different examples of results of currently used methods for aligning a portion of a design for a wafer in design space with the portion of the design for the wafer in wafer space.

FIGS. 11 and 12 illustrate some issues that can arise when using edges of features in the image and the design for alignment. Although FIGS. 11 and 12 will be discussed with respect to the design for a single patterning step of a multi-patterning step process, these same issues can arise for alignment of any portion of a design to the corresponding patterned features in an image. For example, as shown in FIG. 11, a portion of a design may include two features, line 1100 and polygon 1102. In addition, an image generated from output generated by the output acquisition subsystem corresponding to the portion of the design may include two features, line 1104 and polygon 1106. The features in the design and the image appear differently due to the printing of the design on the wafer as described further above.

An image (e.g., a SEM image) can be aligned to a design using edge-to-edge approaches at the upper edge or lower edge of a pattern of interest. For example, as shown in FIG.

11, if lower edges 1108 of the horizontal portions of polygons 1102 and 1106 are used for alignment, then the alignment results for polygon 1106 in areas 1110 and 1112 of the polygon will be different. However, if, as shown in FIG. 12, upper edges 1200 of the horizontal portions of polygons 1102 and 1106 are used for alignment, then the alignment results for polygon 1106 in areas 1110 and 1112 of the polygon will be different. In this manner, depending on which edge of the polygon is used for alignment of the design to the image, the alignment results will be different in different portions of a feature, which is disadvantageous for a number of obvious reasons.

Additional steps described herein may be performed for image-to-design fine alignment. These steps may be performed for measuring relative overlay errors after the image-to-design "coarse" alignment described above has been performed. For example, instead of using edge-to-edge alignment, the embodiments described herein may perform alignment of output acquisition subsystem output (or images generated therefrom) to design using the centers of the features in the output and in the design. In one such example, aligning an image generated from output of the output acquisition subsystem to the design using the centers of the features will produce a much more accurate alignment. Using the centers of features for alignment rather than their edges can also improve the robustness of the alignment for severely distorted patterns and when the image does not have many features for aligning the patterns of interest. Performing image-to-design coarse alignment as described above prior to image-to-design fine alignment described further herein will improve the accuracy and success of the image-to-design fine alignment.

In one embodiment, the computer subsystem(s) are configured for determining design-based center tines of the first and second patterned features in the design and design-based center lines of spaces between the first and second patterned features in the design. In this manner, the computer subsystem(s) may generate foreground/background center lines (horizontal and/or vertical center lines, or center points for contact patterns) for the entire design for the level (or for all of the patterned features in the design that are shown in any one image being processed by the computer subsystem(s) regardless of the multi-patterning step in which the patterned features were printed).

Figure 13:
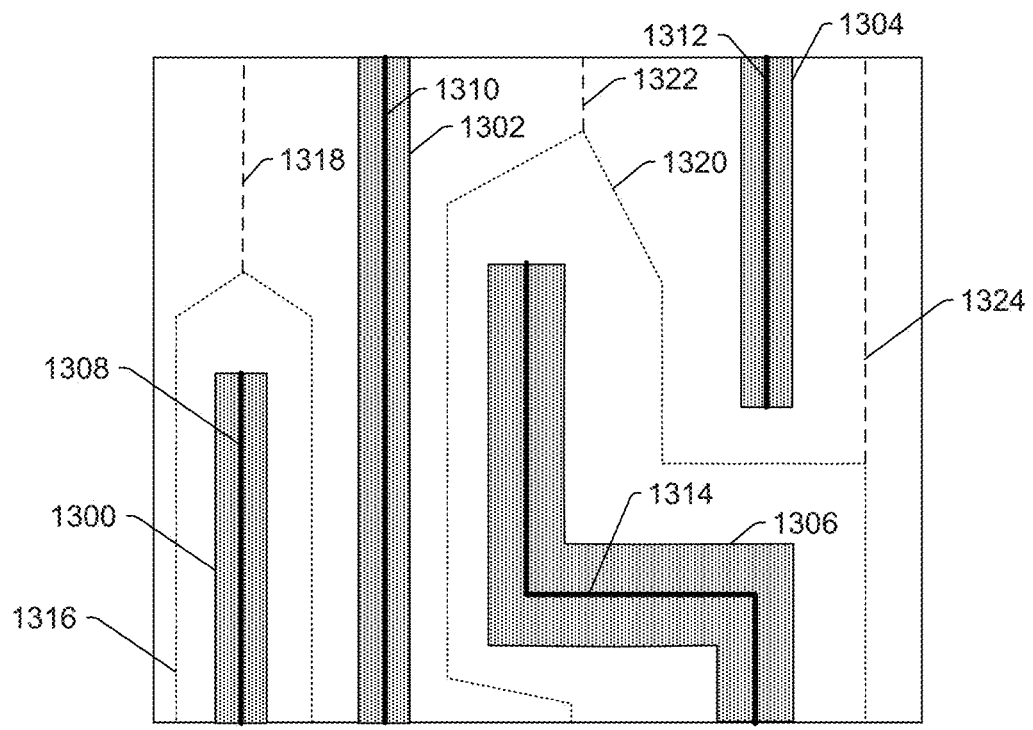
FIG. 13 is a schematic diagram illustrating a plan view of a portion of a design for a wafer in design space with design-based center lines of patterned features in the design and design-based center lines of spaces between the patterned features in the design that can be determined by embodiments described herein.

FIG. 13 illustrates how design-based center lines of patterned features and spaces between the patterned features can be determined. For example, as shown in FIG. 13, a portion of a design for a wafer may include four different features, portions of lines 1300, 1302, and 1304 and polygon 1306. As further shown in FIG. 13, an imaginary design-based center line can be determined through the entirety of the portion of each feature included in the portion of the design. For example, imaginary center lines 1308, 1310, and 1312 may be determined for portions of lines 1300, 1302, and 1304. In addition, imaginary center line 1314 may be determined for polygon 1306. The imaginary center tines may be determined in any suitable manner.

Imaginary design-based center lines may also be generated for the spaces between the patterned features. The design-based center lines for the spaces may be defined by the midpoints between two adjacent features in the design. For example, center line 1316 may be defined based on the midpoints between the center lines of feature 1300 and any adjacent features (e.g., feature 1302). Center line 1318 may be defined based on the midpoints between the center tines of feature 1302 and any adjacent features on the left side of this feature (not shown in FIG. 13) and extending above feature 1300. Center line 1320 may be defined based on the midpoints between the center lines of feature 1306 and any adjacent features (e.g., features 1302 and 1304). Center line 1322 may be defined based on the midpoints between the center lines of features 1302 and 1304. In addition, center line 1324 may be defined based on the midpoints between the center lines of feature 1304 and any adjacent features on the right side of this feature (not shown in FIG. 13). Although the design-based center tines in the spaces between the patterned features are described above as being defined based on the design-based center lines in the patterned features, the design-based center lines in the spaces may be defined based on some other characteristic of the patterned features (e.g., the edges of the patterned features).

In one such embodiment, the computer subsystem(s) are configured for determining image-based center lines of the first and second patterned features in the image and image-based center lines of the spaces between the first and second patterned features in the image. In this manner, the computer subsystem(s) may be configured for, for each of the design-based center lines determined as described above, generating image-based center lines, which may be performed as described further herein. As such, imaginary center lines may also be determined for the patterned features as they appear in the output acquisition subsystem output. The image-based center lines may be horizontal and/or vertical lines and possibly center points for structures such as contacts.

Figure 14:
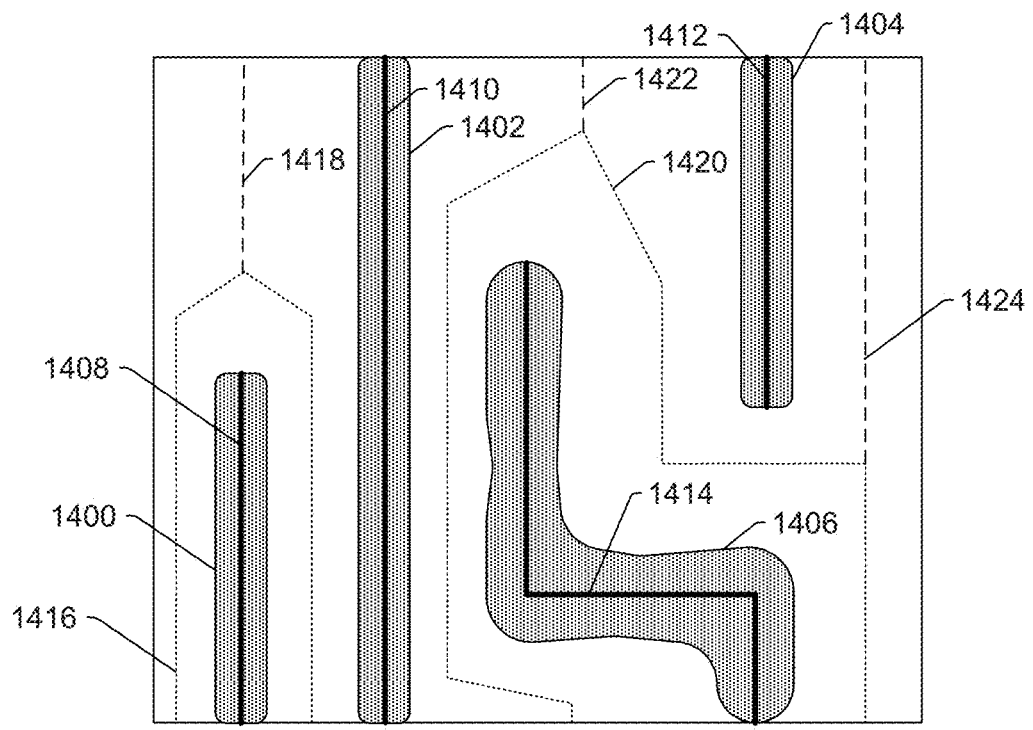
FIG. 14 is a schematic diagram illustrating a plan view of a portion of a design for a wafer in wafer space with image-based center lines of patterned features in the design and image-based center lines of spaces between the patterned features in the design that can be determined by embodiments described herein.

FIG. 14 illustrates how image-based center lines of patterned features and spaces between the patterned features can be determined. For example, a portion of a design formed on a wafer may include four patterned features 1400, 1402, 1404, and 1406, which are shown in FIG. 14 as they might be formed on the wafer and then imaged by the output acquisition subsystem. In addition, as shown in FIG. 14, a portion of a design in output acquisition subsystem output may include four different features corresponding to those shown in FIG. 13, e.g., portions of lines 1400, 1402, and 1404 and polygon 1406 in FIG. 14 correspond to portions of lines 1300, 1302, and 1304 and polygon 1306 in FIG. 13, respectively. As further shown in FIG. 14, an imaginary center line can be determined through the entirety of the portion of each feature included in this portion of the image. For example, imaginary center lines 1408, 1410, and 1412 may be determined for portions of lines 1400, 1402, and 1404, respectively. In addition, imaginary center line 1414 may be determined for polygon 1406. The imaginary center lines may be determined as described further herein.

As further shown in FIG. 14, imaginary center lines may also be generated for the spaces between the patterned features. The center lines for the spaces may be defined by the midpoints between two adjacent features in the design. For example, center line 1416 may be defined based on the midpoints between the center lines of feature 1400 and any adjacent features (e.g., feature 1402). Center line 1418 may be defined based on the midpoints between the center lines of feature 1402 and any adjacent features on the left side of this feature (not shown in FIG. 14) and extending above feature 1400. Center line 1420 may be defined based on the midpoints between the center lines of feature 1406 and any adjacent features e.g., features 1402 and 1404). Center line 1422 may be defined based on the midpoints between the center lines of features 1402 and 1404. In addition, center line 1424 may be defined based on the midpoints between the center lines of feature 1404 and any adjacent features on the right side of this feature (not shown in FIG. 14). In addition, although the center lines in the spaces between the patterned features are described above as being defined based on the center lines in the patterned features, the center lines in the spaces may be defined based on some other characteristic of the patterned features (e.g., the edges of the patterned features).

In some instances, the image-based center tines may be determined by detecting edge locations of two opposite patterned feature image edges and then calculating the center of the two opposite edges. For example, determining the image-based center lines may include automatically determining locations in the image of one or more edges of one or more patterned features formed on the wafer. In this manner, the embodiments described herein may be configured for automatic determination of SEM edge locations. In some instances, the edge locations may be determined using one-dimensional (1D) gradient profiles. For example, 1D gray scale profiles may be automatically generated based on output generated along a line that is either orthogonal to a center line through the patterned structure or parallel to the center line through the patterned structure. The computer subsystem(s) may also be configured for automatic generation of 1D gradient profiles, which may be automatically generated by taking a gradient of a 1D gray scale profile determined as described above. Then, edge locations may be automatically determined by finding the strongest positive or negative gradient peaks within a 1D gradient profile. In other words, the peak points in the 1D gradient profile can be selected as the edge locations. The image-based center lines may then be determined based on the detected edge locations in any suitable manner. However, the edges can be located using other measurement algorithms besides using gradient profiles.

Figure 15:
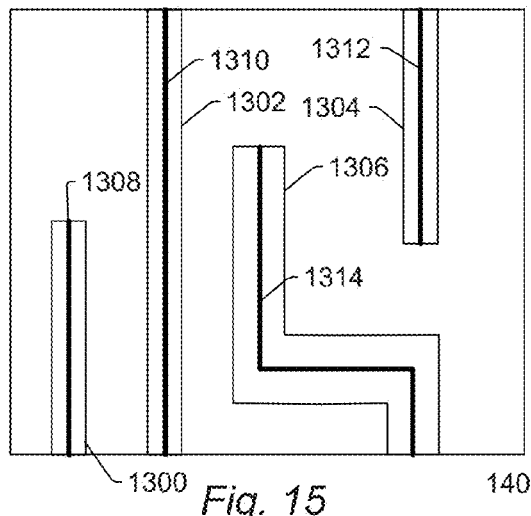
FIGS. 15-17 are schematic diagrams illustrating plan views of a portion of a design for a wafer in design and wafer space and how they can be aligned by embodiments described herein.
Figure 16:
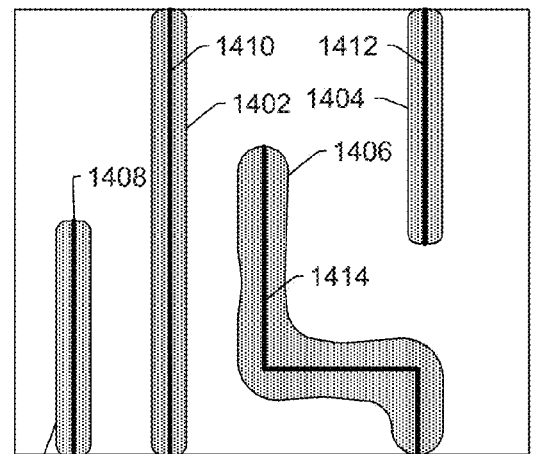
Figure 17:
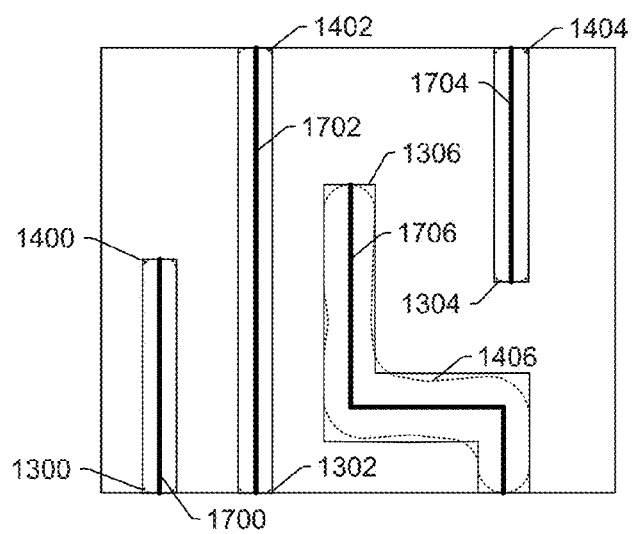

Since the design-based center lines of the patterned features and spaces in the design can be determined reproducibly and since the image-based center lines of the patterned features and spaces in the output should be able to be determined substantially reproducibly, the design- and image-based imaginary center lines can be used to align the patterned features in the design to the patterned features in the output relatively reproducibly. FIGS. 15-17 illustrate how the design- and image-based imaginary center lines of patterned features in a portion of a design and an image can be used for aligning the design to the image. Similar alignment can be performed for the design- and image-based center lines determined for spaces between the patterned features. In addition, although FIGS. 15-17 are discussed without regard to the patterning step in which any of the patterned features shown in these figures are printed on the wafer, such alignment can be performed as described further herein on a feature by feature basis and/or collectively for two or more patterned features formed in a single patterning step of a multi-patterning step process.

The design- and image-based center lines shown in the alignment of FIGS. 15-17 are those determined as described above with respect to FIGS. 13 and 14. For example, as shown in FIG. 15, design-based center lines 1308, 1310, 1312, and 1314 are determined as described above for patterned features 1300, 1302, 1304, and 1306, respectively. In addition, as shown in FIG. 16, image-based center lines 1408, 1410, 1412, and 1414 are determined as described above for patterned features 1400, 1402, 1404, and 1406, respectively.

As shown in 17, alignment 1700 of the center lines 1308 and 1408 can be used to reproducibly align line 1300 in the design to line 1400 in the output. In another example, alignment 1702 of the center lines 1310 and 1410 can be used to reproducibly align line 1302 in the design to line 1402 in the output. In addition, alignment 1704 of the center lines 1312 and 1412 can be used to reproducibly align line 1304 in the design to line 1404 in the output. Furthermore, alignment 1706 of the center lines 1314 and 1414 can be used to reproducibly align polygon 1306 in the design to polygon 1406 in the output.

In some embodiments, the computer subsystem(s) are configured for determining an additional offset between a position of each of the image-based center lines of the first patterned features and the spaces between the first patterned features in the image and a position of its corresponding design-based center line, and the positions of the corresponding design-based center lines used to determine the additional offsets are determined with respect to a position of the design for the first patterned features, determined by the aligning of all of the design. In this manner, the computer subsystem(s) may be configured for determining x and/or y image-to-design alignment offsets for each design-based center line determined for the first patterned features and/or the spaces between the first patterned features by measuring x and/or y offset between the image-based and design-based center lines. For example, any amount that a design-based center line is shifted such that it is aligned to its corresponding image-based center line may be determined as the additional offset for that design-based center line. In addition, the additional offsets for the first patterned features and/or the spaces between these features may be determined on a per feature basis. In other words, a different additional offset may be determined for each first patterned feature and/or each space between the first patterned features. The alignment of the design- and image-based center lines may otherwise be performed as described herein. In addition, the additional offset may otherwise be determined as described herein (e.g., based on the number of pixels that the design-based center line is shifted to achieve alignment and possibly the distance that the number of pixels corresponds to on the wafer).

As described above, the steps involved in performing the image-to-design fine alignment may be performed after the steps for determining the image-to-design coarse alignment. Therefore, when determining the additional offsets for the first patterned features and spaces between those patterned features, the input to the fine alignment steps may be the output of the coarse alignment steps. In other words, the fine alignment steps may be performed using the coarse alignment results as the starting point for the alignment. In this manner, the design- and image-based center lines may be overlaid on the alignment results produced by coarse alignment and then the design- and image-based center lines may be aligned to each other. In this manner, the offset determined for the first patterned features and the spaces between those patterned features will be determined based on the position(s) determined by aligning of the design to the first patterned features. In other words, since the design for the first patterned features is not synthetically shifted as described herein during coarse alignment, the positions of the first patterned features and spaces between those features) used to determine the additional offsets will be non-synthetically shifted positions.

In another embodiment, the computer subsystem are configured for determining another additional offset between a position of each of the image-based center lines of the second patterned features and the spaces between the second patterned features in the image and a position of its corresponding design-based center line, and the positions of the corresponding design-based center lines used to determine the other additional offsets are determined with respect to the shifted position of the design tor the second patterned features. In this manner, the computer subsystem(s) may be configured for determining x and/or y image-to-design alignment offsets for each design-based center line determined for the second patterned features and/or the spaces between the second patterned features by measuring x and/or y offset between the image-based and design-based center lines. For example, any amount that a design-based center line is shifted such that it is aligned to its corresponding image-based center line may be determined as the additional offset for that design-based center line. In addition, the additional offsets for the second patterned features and/or the spaces between these features may be determined on a per feature basis. In other words, a different additional offset may be determined for each second patterned feature and/or each space between the second patterned features. The alignment of the design- and image-based center lines may otherwise be performed as described herein. In addition, the additional offset may otherwise be determined as described herein (e.g., based on the number of pixels that the design-based center line is shifted to achieve alignment and possibly the distance that the number of pixels corresponds to on the wafer).

As described above, the steps involved in performing the image-to-design fine alignment may be performed after the steps for determining the image-to-design coarse alignment. Therefore, when determining the additional offsets for the second patterned features and spaces between those patterned features, the input to the fine alignment steps may be the output of the coarse alignment steps. In other words, the fine alignment steps may be performed using the coarse alignment results as the starting point for the fine alignment. In this manner, the design- and image-based center lines may be overlaid on the alignment results produced by coarse alignment and then the design- and image-based center lines may be aligned to each other. In this manner, the offset determined for the second patterned features and the spaces between those patterned features will be determined based on the shifted position(s) determined by aligning only the design for the second patterned features to the second patterned features in the image. In other words, since the design for the second patterned features is synthetically shifted as described herein during coarse alignment, the positions of the second patterned features (and spaces between those features) used to determine the additional offsets will be synthetically shifted positions.

In an additional embodiment, the computer subsystem(s) are configured for performing global alignment of two or more of the image-based center lines of the first patterned features and the spaces between the first patterned features and their corresponding design-based center lines by finding a global minimum of the additional offsets between the two or more of the image-based center lines and their corresponding design-based center lines. For example, for any given multi-patterning step, the computer subsystem(s) may generate an optimal (e.g., using a least squares method) global x and/or y alignment offset between corresponding features in the image and design that are printed in the given multi-patterning step in order to minimize the distance between multiple image- and design-based center lines in the image. In this manner, the computer subsystem(s) may be configured to perform global alignment for all of the first patterned features in an image by aligning the design- and image-based center lines for all of the first patterned features in the image. As such, unlike the fine alignment described above that is performed on a per feature basis, this fine alignment is performed on a per patterning step basis for multiple patterned features corresponding to the patterning step for which the alignment is being performed. Finding the global minimum of the additional offsets as described above may be performed using any suitable method and/or system. Once the global minimum has been found, the global alignment of the center lines of all of the first patterned features in the image and the corresponding features in the design will be achieved. In this manner, the computer subsystem(s) may be configured tor global fine alignment between the first patterned features and the design.

In a further embodiment, the computer subsystem(s) are configured for modifying the offset based on results of performing the global alignment. For example, since the offset was determined based on results of coarse alignment, that offset can be modified based on the global fine alignment described above. In this manner, the computer subsystem(s) may be configured to correct the position of the first patterned features that is determined by coarse alignment, which is used as a reference for other steps performed for other patterned features printed in multi-patterning steps other than the first patterning step, based on the fine alignment results produced for the first patterned features. The modified offset may then be used for other step(s) described herein. In this manner, the reference used in additional steps may be determined on a substantially small scale thereby allowing determination of overlay errors using that reference on a substantially small scale. The offset may be modified in any suitable manner (e.g., adjusting the x and/or y components of the offset based on any shifting performed to achieve global alignment).

In some embodiments, the computer subsystem(s) are configured for determining a second offset for the design for the second patterned features by performing global alignment of two or more of the image-based center lines of the second patterned features and the spaces between the second patterned features and their corresponding design-based center lines by finding a global minimum of the other additional offsets between the two or more of the image-based center lines of the second patterned features and the spaces between the second patterned features and their corresponding design-based center lines. For example, as described above, for any given multi-patterning step, the computer subsystem(s) may generate an optimal (e.g., using a least squares method) global x/y alignment offset between corresponding features in the image and design that are printed in the given multi-patterning step in order to minimize the distance between multiple image- and design-based center lines in the image. In this manner, the computer subsystem(s) may be configured to perform global alignment for all of the second patterned features in an image by aligning the design- and image-based center lines for all of the second patterned features in the image. As such, unlike the fine alignment described above that is performed on a per feature basis, this fine alignment is performed on a per patterning step basis for multiple patterned features in an image corresponding to the patterning step for which the alignment is being performed. Finding the global minimum of the additional offsets as described above may be performed using any suitable method and/or system. Once the global minimum has been found, the global alignment of the center lines of all of the second patterned features in the image and the corresponding features in the design will be achieved. In this manner, the computer subsystem(s) may be configured for global fine alignment between the second patterned features and the design. The second offset may then be determined based on the global fine alignment results in any suitable manner.

In additional embodiments, the one or more computer subsystems are configured for determining a final offset by applying the second offset to the modified offset, and the final offset is equal to fine relative overlay error between the first patterned features on the wafer and the second patterned features on the wafer. For example, the offset determined based on results of coarse alignment that has been modified by the global fine alignment performed for the first patterned features can be modified based on the second offset determined based on the global fine alignment performed for the second patterned features and the spaces between these patterned features. In this manner, the computer subsystem(s) may be configured to correct the offset that is determined by coarse alignment based on the fine alignment results produced for the first patterned features as well as the fine alignment results produced for the second patterned features. In other words, the computer subsystem(s) may determine overlay shifts across multiple layers using the image-to-design fine alignment offsets for each layer. The final offset may then be used for other step(s) described herein. The offset may be modified in any suitable manner (e.g., adjusting the x and/or y components of the modified offset based on the x and/or y components of the second offset).

Since the modified offset and the second offset are determined using the fine alignment steps described herein, the final offset may determined on a substantially small scale thereby allowing determination of overlay errors using that reference on a substantially small scale. In this manner, the fine relative overlay error may be "fine" in that it is determined on a finer scale than the original relative overlay error. For example, in one embodiment, the one or more computer subsystems are capable of determining fine relative overlay errors equal to or smaller than 5 nm. In this manner, one advantage of the embodiments described herein is the use of automatic image-to-design fine alignment using center lines that enables measuring substantially small (e.g., 2 nm to 5 nm) relative overlay errors.

In another embodiment, as described further above, third patterned features are printed on the level of the wafer with a third patterning step. In one such embodiment, the computer subsystem(s) are configured for shifting only the design for the third patterned features from a position of the design for the third patterned features, determined by the aligning all of the design, to a shifted position of the design for the third patterned features by aligning only the design for the third patterned features to only the third patterned features in the image. The computer subsystem(s) may be configured to perform this step as described further above. This step may also be performed for any other patterned features printed on the wafer with any other patterning step, e.g., fourth patterned features, etc.

In this embodiment, the computer subsystem(s) also are configured for determining an offset between the position of the design for the third patterned features and the shifted position of the design for the third patterned features, and the offset for the third patterned features is equal to relative overlay error between the first patterned features on the wafer and the third patterned features on the wafer. This step may be performed by the computer subsystem(s) as described further herein. This offset is also described further herein.

In this embodiment, the computer subsystem(s) are further configured for modifying the offset for the third patterned features based on results of performing the global alignment for the first patterned features and the spaces between the first patterned features. Modifying the offset for the third patterned features may be performed as described further herein with respect to the second patterned features. This step may also be performed by the computer subsystem(s) for any other patterned features printed on the wafer in any other patterning step, fourth patterned features, etc.

In this embodiment, the computer subsystem(s) are configured for determining design-based center lines and determining image-based center lines as described herein for the third patterned features and the spaces between the third patterned features. Determining the design-based center lines and image-based center lines for the third patterned features and the spaces between these features may be performed as described further herein. These steps may also be performed by the computer subsystem(s) for any other patterned features printed on the wafer in any other patterning step, e.g., fourth patterned features, etc.

In this embodiment, the computer subsystem(s) are configured for determining a further additional offset between a position of each of the image-based center lines of the third patterned features and the spaces between the third patterned features in the image and a position of its corresponding design-based center line, and the positions of the corresponding design-based center lines used to determine the further additional offsets are determined with respect to the shifted position of the design for the third patterned features. Determining the further additional offset may be performed as described further herein with respect to determining the other additional offset. This step may also be performed by the computer subsystem(s) for any other patterned features printed on the wafer in any other patterning step, e.g., fourth patterned features, etc.

In this embodiment, the computer subsystem(s) are also configured for determining a third offset for the design for the third patterned features by performing global alignment of two or more of the image-based center lines of the third patterned features and the spaces between the third patterned features and their corresponding design-based center tines by finding a global minimum of the further additional offsets between the two or more of the image-based center lines of the third patterned features and the spaces between the third patterned features and their corresponding design-based center lines. Determining the third offset my be performed as described further herein with respect to determining the second offset. This step may also be performed by the computer subsystem(s) for any other patterned features printed on the wafer in any other patterning step, e.g., fourth patterned features, etc.

In this embodiment, the computer subsystem(s) are further configured for determining another final offset by applying the third offset to the modified offset for the third patterned features, and the other final offset is equal to fine relative overlay error between the first patterned features on the wafer and the third patterned features on the wafer. Determining the other final offset may be performed as described further herein with respect to determining the final offset. This step may also be performed by the computer subsystem(s) for any other patterned features printed on the wafer in any other patterning step, e.g., fourth patterned features, etc. The other final offset may be further configured as described herein.

In one such embodiment, the one or more computer subsystems are configured for determining fine relative overlay error between the second patterned features on the wafer and the third patterned features on the wafer based on the final offset and the other final offset. For example, to measure relative x/y overlay errors between any two patterning steps (using design as a reference), the computer subsystem(s) may determine the difference between the x/y image-to-design alignment offsets determined as described above for those two patterning steps. For example, the fine relative overlay error between the second and third patterning steps (using the design for the first patterning step as a reference) may be determined based on the difference between the final offset and the other final offset determined as described further herein. In this manner, the embodiments described herein can determine the fine relative overlay error between any two patterning steps performed in a multi-patterning step process. The fine relative overlay error is "fine" as described further herein.

In some embodiments, the first and second patterned features are formed in a die on the wafer. For example, unlike previously used methods and systems, the embodiments described herein do not need to be performed based on special overlay targets formed in a scribe line of a wafer. Instead, the embodiments described herein can be used to measure overlay errors on all types of complex patterns formed in the dies on the wafer. Therefore, the embodiments described herein may be capable of predicting more accurate, actual in-die overlay errors than previously used methods and systems. In addition, the embodiments described herein advantageously provide high throughput in-die, multi-patterning step, relative overlay error measurements.

In another embodiment, the first and second patterned features for which the aligning, shifting, and determining are performed are not selected by a user. For example, one advantage of the embodiments described herein is that the embodiments provide a relatively fast, automated mechanism to measure in-die relative overlay error between any two mask designs printed on a level of a wafer without any user selection of in-die overlay measurement sites during setup.

In a further embodiment, the first and second patterned features for which the aligning, shifting, and determining are performed include any patterned features formed in a die on the wafer. In some embodiments, the first and second patterned features for which the aligning, shifting, and determining are performed are not selected based on symmetry of the first and second patterned features along an imaginary axis. For example, one advantage of the embodiments described herein is that they can measure relative overlay error on any in-die site and, unlike previously used methods and systems, do not have the constraint of only selecting sites with pattern symmetry along a virtual x or y axis. In addition, the embodiments described herein are capable of automatic image-to-design fine alignment using center lines in order to measure substantially small (e.g., on the order of 2 nm to 5 nm) relative overlay errors on any kind of in-die pattern geometry without any constraints on the pattern geometry.

Another embodiment relates to a computer-implemented method for determining overlay error between different patterned features of a design printed on a wafer in a multi-patterning step process. The method includes the aligning, shifting, and determining steps described above.

Each of the steps of the method may be performed as described further herein. The method may also include any other step(s) that can be performed by the output acquisition subsystem and/or computer subsystem(s) or system(s) described herein. The aligning, shifting, and determining steps are performed by one or more computer systems, which may be configured according to any of the embodiments described herein. In addition, the method described above may be performed by any of the system embodiments described herein.

Figure 18:
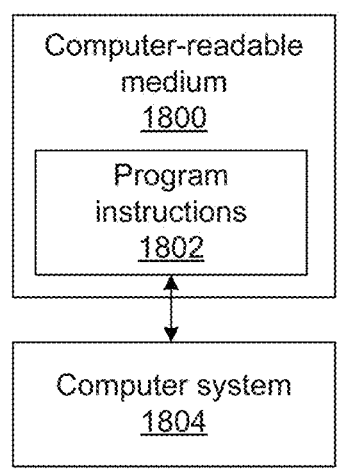
FIG. 18 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for determining overlay error between different patterned features of a design printed on a wafer in a multi-patterning step process. One such embodiment is shown in FIG. 18. In particular, as shown in FIG. 18, non-transitory computer-readable medium 1800 includes program instructions 1802 executable on computer system 1804. The computer-implemented method may include any step(s) of any method(s) described herein.

Program instructions 1802 implementing methods such as those described herein may be stored on computer-readable medium 1800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 1804 may be configured according to any of the embodiments described herein.

Further modifications and alternative embodiments of various aspects of the invention will be apparent to those skilled in the art in view of this description. For example, methods and systems for determining overlay error between different patterned features of a design printed on a wafer in a multi-patterning step process are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine overlay error between different patterned features of a design printed on a wafer in a multi-patterning step process, comprising:
an output acquisition subsystem comprising at least an energy source and a detector, wherein the energy source is configured to generate energy that is directed to a wafer, wherein the detector is configured to detect energy from the wafer and to generate output responsive to the detected energy, wherein first and second patterned features are printed on a level of the wafer with first and second patterning steps, respectively, and wherein a design for the level of the wafer comprises a design for the first patterned features and a design for the second patterned features; and
one or more computer subsystems configured for:
aligning the design for the level of the wafer to an image for the wafer generated from the output by aligning the design for the first patterned features to the first patterned features in the image thereby aligning all of the design for the level to the first patterned features;

shifting only the design for the second patterned features from a position of the design for the second patterned features, determined by said aligning all of the design, to a shifted position of the design for the second patterned features by aligning only the design for the second patterned features to only the second patterned features in the image; and determining an offset between the position of the design for the second patterned features and the shifted position of the design for the second patterned features, wherein the offset is equal to relative overlay error between the first patterned features on the wafer and the second patterned features on the wafer.

2. The system of claim 1, wherein the design for the level of the wafer further comprises a design for third patterned features, wherein the third patterned features are printed on the level of the wafer with a third patterning step, and wherein the one or more computer subsystems are further configured for:

shifting only the design for the third patterned features from a position of the design for the third patterned features, determined by said aligning all of the design, to a shifted position of the design for the third patterned features by aligning only the design for the third patterned features to only the third patterned features in the image; and determining an offset between the position of the design for the third patterned features and the shifted position of the design for the third patterned features, wherein the offset for the third patterned features is equal to relative overlay error between the first patterned features on the wafer and the third patterned features on the wafer.

3. The system of claim 2, wherein the one or more computer subsystems are further configured for determining relative overlay error between the second patterned features on the wafer and the third patterned features on the wafer based on the offset determined for the second patterned features and the offset determined for the third patterned features.

4. The system of claim 1, wherein the one or more computer subsystems are further configured for determining design-based center lines of the first and second patterned features in the design and design-based center lines of spaces in the design.

5. The system of claim 4, wherein the one or more computer subsystems are further configured for determining image-based center lines of the first and second patterned features in the image and image-based center lines of the spaces in the image.

6. The system of claim 5, wherein the one or more computer subsystems are further configured for determining additional offsets between 1) a position of each of the image-based center lines of the first patterned features in the image and a position of a corresponding one of the design-based center lines determined for the first patterned features and 2) a position of each of the image-based center lines of the spaces between the first patterned features in the image and a position of a corresponding one of the design-based center lines determined for the spaces between the first patterned features, and wherein the position of each of the corresponding one of the design-based center lines used to determine the additional offsets is determined with respect to a position of the design for the first patterned features, determined by said aligning all of the design.

7. The system of claim 6, wherein the one or more computer subsystems are further configured for determining other additional offsets between 1) a position of each of the image-based center lines of the second patterned features in the image and a position of a corresponding one of the design-based center lines determined for the second patterned features and 2) a position of each of the image-based center lines of the spaces between the second patterned features in the image and a position of a corresponding one of the design-based center lines determined for the spaces between the second patterned features, and wherein the position of each of the corresponding one of the design-based center lines used to determine the other additional offsets is determined with respect to the shifted position of the design for the second patterned features.

8. The system of claim 7, wherein the one or more computer subsystems are further configured for performing global alignment of two or more of 1) the image-based center lines of the first patterned features and the design-based center lines corresponding to the first patterned features and 2) the image-based center lines of the spaces between the first patterned features and the design-based center lines corresponding to the spaces between the first patterned features by finding a global minimum of the additional offsets between the two or more of 1) the image-based center lines of the first patterned features and the design-based center lines corresponding to the first patterned features and 2) the image-based center lines of the spaces between the first patterned features and the design-based center lines corresponding to the spaces between the first patterned features.

9. The system of claim 8, wherein the one or more computer subsystems are further configured for modifying the offset determined between the position of the design for the second patterned features and the shifted position of the design for the second patterned features based on results of performing the global alignment, and wherein said modifying the offset generates a modified offset.

10. The system of claim 9, wherein the one or more computer subsystems are further configured for determining a second offset for the design for the second patterned features by performing global alignment of two or more of 1) the image-based center lines of the second patterned features and the design-based center lines corresponding to the second patterned features and 2) the image-based center lines of the spaces between the second patterned features and the design-based center lines corresponding to the spaces between the second patterned features by finding a global minimum of the other additional offsets between the two or more of 1) the image-based center lines of the second patterned features and the design-based center lines corresponding to the second patterned features and 2) the image-based center lines of the spaces between the second patterned features and the design-based center lines corresponding to the spaces between the second patterned features.

11. The system of claim 10, wherein the one or more computer subsystems are further configured for determining a final offset by applying the second offset to the modified offset, and wherein the final offset is equal to fine relative overlay error between the first patterned features on the wafer and the second patterned features on the wafer.

12. The system of claim 11, wherein the one or more computer subsystems are capable of determining fine relative overlay errors equal to or smaller than 5 nm.

13. The system of claim 11, wherein the design for the level of the wafer further comprises a design for third patterned features, wherein the third patterned features are printed on the level of the wafer with a third patterning step, and wherein the one or more computer subsystems are further configured for:
- shifting only the design for the third patterned features from a position of the design for the third patterned features, determined by said aligning all of the design, to a shifted position of the design for the third patterned features by aligning only the design for the third patterned features to only the third patterned features in the image;
- determining an offset between the position of the design for the third patterned features and the shifted position of the design for the third patterned features, wherein the offset for the third patterned features is equal to relative overlay error between the first patterned features on the wafer and the third patterned features on the wafer;
- modifying the offset for the third patterned features based on results of performing the global alignment for the first patterned features and the spaces between the first patterned features, wherein said modifying the offset for the third patterned features generates a modified offset for the third patterned features;
- performing said determining design-based center lines and said determining image-based center lines for the third patterned features and spaces between the third patterned features;
- determining further additional offsets between 1) a position of each of the image-based center lines of the third patterned features in the image and a position of a corresponding one of the design-based center lines determined for the third patterned features and 2) a position of each of the image-based centered lines of the spaces between the third patterned features in the image and a position of a corresponding one of the design-based center lines determined for the spaces between the third patterned features, wherein the position of each of the corresponding one of the design-based center lines used to determine the further additional offsets is determined with respect to the shifted position of the design for the third patterned features;
- determining a third offset for the design for the third patterned features by performing global alignment of two or more of 1) the image-based center lines of the third patterned features and the design-based center lines corresponding to the third patterned features and 2) the image-based center lines of the spaces between the third patterned features and the design-based center lines corresponding to the spaces between the third patterned features by finding a global minimum of the further additional offsets between the two or more of 1) the image-based center lines of the third patterned features and the design-based center lines corresponding to the third patterned features and 2) the image-based center lines of the spaces between the third patterned features and the design-based center lines corresponding to the spaces between the third patterned features; and
- determining another final offset by applying the third offset to the modified offset for the third patterned features, wherein the other final offset is equal to fine relative overlay error between the first patterned features on the wafer and the third patterned features on the wafer.

14. The system of claim 13, wherein the one or more computer subsystems are further configured for determining fine relative overlay error between the second patterned features on the wafer and the third patterned features on the wafer based on the final offset and the other final offset.

15. The system of claim 1, wherein the first and second patterned features are formed in a die on the wafer.

16. The system of claim 1, wherein the first and second patterned features for which said aligning, said shifting, and said determining are performed are not selected by a user.

17. The system of claim 1, wherein the first and second patterned features for which said aligning, said shifting, and said determining are performed are not selected based on symmetry of the first and second patterned features along an imaginary axis.

18. The system of claim 1, wherein the first and second patterned features for which said aligning, said shifting, and said determining are performed comprise any patterned features formed in a die on the wafer.

19. The system of claim 1, wherein the energy directed to the wafer comprises light, and wherein the energy detected from the wafer comprises light.

20. The system of claim 1, wherein the energy directed to the wafer comprises electrons, and wherein the energy detected from the wafer comprises electrons.

21. A non-transitory computer-readable medium, storing program instructions executable on a computer system for performing a computer-implemented method for determining overlay error between different patterned features of a design printed on a wafer in a multi-patterning step process, wherein the computer-implemented method comprises:
- aligning a design for a level of a wafer to an image for the wafer generated from output generated by an output acquisition system comprising at least an energy source and a detector, wherein the energy source is configured to generate energy that is directed to a wafer, wherein the detector is configured to detect energy from the wafer and to generate output responsive to the detected energy, wherein first and second patterned features are printed on the level of the wafer with first and second patterning steps, respectively, wherein a design for the level of the wafer comprises a design for the first patterned features and a design for the second patterned features, and wherein said aligning comprises aligning the design for the first patterned features to the first patterned features in the image thereby aligning all of the design for the level to the first patterned features;
- shifting only the design for the second patterned features from a position of the design for the second patterned features, determined by said aligning all of the design, to a shifted position of the design for the second patterned features by aligning only the design for the second patterned features to only the second patterned features in the image; and
- determining an offset between the position of the design for the second patterned features and the shifted position of the design for the second patterned features, wherein the offset is equal to relative overlay error between the first patterned features on the wafer and the second patterned features on the wafer, and wherein said aligning, said shifting, and said determining are performed by the computer system.

22. A computer-implemented method for determining overlay error between different patterned features of a design printed on a wafer in a multi-patterning step process, comprising:

aligning a design for a level of a wafer to an image for the wafer generated from output generated by an output acquisition system comprising at least an energy source and a detector, wherein the energy source is configured to generate energy that is directed to a wafer, wherein the detector is configured to detect energy from the wafer and to generate output responsive to the detected energy, wherein first and second patterned features are printed on the level of the wafer with first and second patterning steps, respectively, wherein a design for the level of the wafer comprises a design for the first patterned features and a design for the second patterned features, and wherein said aligning comprises aligning the design for the first patterned features to the first patterned features in the image thereby aligning all of the design for the level to the first patterned features;

shifting only the design for the second patterned features from a position of the design for the second patterned features, determined by said aligning all of the design, to a shifted position of the design for the second patterned features by aligning only the design for the second patterned features to only the second patterned features in the image; and determining an offset between the position of the design for the second patterned features and the shifted position of the design for the second patterned features, wherein the offset is equal to relative overlay error between the first patterned features on the wafer and the second patterned features on the wafer, and wherein said aligning, said shifting, and said determining are performed by one or more computer systems.

\* \* \* \* \*